United States Patent
Sun et al.

(10) Patent No.: US 12,422,634 B2
(45) Date of Patent: Sep. 23, 2025

(54) OPTICAL MODULE PACKAGE STRUCTURE

(71) Applicant: INNOLIGHT TECHNOLOGY (SUZHOU) LTD., Jiangsu (CN)

(72) Inventors: Yuzhou Sun, Jiangsu (CN); Zhenzhong Wang, Jiangsu (CN); Dengqun Yu, Jiangsu (CN)

(73) Assignee: INNOLIGHT TECHNOLOGY (SUZHOU) LTD., Jiangsu (CN)

( * ) Notice: Subject to any disclaimer, the term of this patent is extended or adjusted under 35 U.S.C. 154(b) by 245 days.

(21) Appl. No.: 18/032,571

(22) PCT Filed: Aug. 3, 2021

(86) PCT No.: PCT/CN2021/110316
§ 371 (c)(1),
(2) Date: Apr. 19, 2023

(87) PCT Pub. No.: WO2022/083225
PCT Pub. Date: Apr. 28, 2022

(65) Prior Publication Data
US 2023/0333335 A1    Oct. 19, 2023

(30) Foreign Application Priority Data
Oct. 23, 2020   (CN) .......................... 202011143357.7

(51) Int. Cl.
*G02B 6/42*    (2006.01)
(52) U.S. Cl.
CPC ........... *G02B 6/4269* (2013.01); *G02B 6/428* (2013.01)
(58) Field of Classification Search
CPC .... G02B 6/4269; G02B 6/428; G02B 6/4279; G02B 6/4268; G02B 6/4251; H01L 23/367; H01L 25/16; H01L 25/167
See application file for complete search history.

(56) References Cited

U.S. PATENT DOCUMENTS 4,684,245 A * 8/1987 Goldring .............. G02B 6/4292
                                                          356/41
7,120,077 B2 * 10/2006 Jakobs ..................... G11C 8/18
                                                          361/728
(Continued)

FOREIGN PATENT DOCUMENTS

CN          101872042          10/2010
CN          104283023          1/2015
(Continued)

OTHER PUBLICATIONS

Mu Jianwei; Shao Qian; Wu Tao; Du Guangchao; Tang Yongzheng, "Optical Module", Sep. 22, 2020, Hisense Broadband Multimedia Technology Co Ltd, Entire Document (Translation of CN 111694112) (Year: 2020).*

(Continued)

*Primary Examiner* — Stephen S Sul
(74) *Attorney, Agent, or Firm* — JCIPRNET

(57) ABSTRACT

An optical module package structure, comprising a housing, and a circuit board, a first device, and a sub-board that are packaged in the housing. The housing comprises a first housing and a second housing. An outer surface of the first housing is a main heat-dissipation surface. The first device is electrically connected to the circuit board by means of the sub-board. A first signal line is provided on the circuit board. An extension section is provided on the sub-board. The sub-board partially overlaps the circuit board, and is connected to same. The first signal line extends to the extension section. The surfaces of the sub-board and the circuit board which partially overlap each other face opposite directions. The first device is electrically connected to the extension section. The first device is provided with a heat-dissipation surface. The heat-dissipation surface faces the first housing, and is thermally connected to same.

17 Claims, 4 Drawing Sheets

(56) References Cited

U.S. PATENT DOCUMENTS

| | | | |
|---|---|---|---|
| 9,568,694 B2* | 2/2017 | Mizobuchi | G02B 6/4279 |
| 10,617,034 B2* | 4/2020 | Hubahib Gaviola | |
| | | | H05K 7/20336 |
| 2009/0220248 A1* | 9/2009 | Hudgins | H04B 10/075 |
| | | | 398/183 |
| 2016/0085038 A1* | 3/2016 | Decker | G02B 6/428 |
| | | | 385/14 |
| 2016/0329658 A1* | 11/2016 | Wilcox | H01R 13/6205 |
| 2018/0035528 A1 | 2/2018 | Kim et al. | |
| 2018/0206324 A1* | 7/2018 | Hayakawa | H05K 7/20 |
| 2019/0041576 A1* | 2/2019 | Byrd | G02B 6/12004 |
| 2022/0006253 A1* | 1/2022 | Li | G02B 6/4207 |
| 2022/0075133 A1* | 3/2022 | Lin | G02B 6/4272 |
| 2022/0113480 A1* | 4/2022 | Erickson | H01L 25/167 |

FOREIGN PATENT DOCUMENTS

| | | | |
|---|---|---|---|
| CN | 204405902 | | 6/2015 |
| CN | 109287092 | | 1/2019 |
| CN | 211348752 | | 8/2020 |
| CN | 111694112 A | * | 9/2020 |

OTHER PUBLICATIONS

"International Search Report (Form PCT/ISA/210) of PCT/CN2021/110316," mailed on Oct. 29, 2021, with English translation thereof, pp. 1-4.

"Written Opinion of the International Searching Authority (Form PCT/ISA/237) of PCT/CN2021/110316," mailed on Oct. 29, 2021, pp. 1-3.

* cited by examiner

OPTICAL MODULE PACKAGE STRUCTURE

CROSS-REFERENCE TO RELATED APPLICATION

This application is a 371 application of an international PCT application serial no. PCT/CN2021/110316, filed on Aug. 3, 2021, which claims the priority benefit of China application no. 202011143357.7, filed on Oct. 23, 2020. The entirety of each of the above-mentioned patent applications is hereby incorporated by reference herein and made a part of this specification.

TECHNICAL FIELD

The disclosure relates to the technical field of optical communication, and in particular, to an optical module package structure.

DESCRIPTION OF RELATED ART

As shown in FIG. 1 and FIG. 2, an optical module generally includes a housing 10' and an optoelectronic component packaged in the housing 10'. The optoelectronic component generally includes a circuit board 20', a high-speed electrical chip 40', a control chip 30', optoelectronic chips 50', and optical elements 60'. The housing 10' is generally divided into upper and lower housings: a first housing 11' and a second housing 12'. The first housing 11' is closer to the heat-dissipation region of the optical cage and so that with a faster heat-dissipation speed, and its outer surface is the main heat-dissipation surface 111' of the housing 10'. The heat-dissipation speed of the second housing 12' is relatively slow, and its outer surface is a secondary heat-dissipation surface 121'. The high-speed electrical chip 40' and the control chip 30' are arranged on the circuit board 20'. The optoelectronic chip 50' is generally arranged on a heat sink 70' with high thermal conductivity and is then electrically connected to the circuit board 20' by wire-bonding or other means.

As the density of modules increases, from the original single channel, to 4 channels, and then to 8 channels, the components are also multiplied, there are more and more components that need to be placed on the circuit board 20', and more and more high-speed signal lines 21' in the circuit board 20', and many of them need to be routed on the inner layer. The structure of inner layer trace requires two reference grounds (GND) and one signal layer, which takes up much space in the circuit board for trace. For the main high-speed electrical chip 40', the power consumption is high, so it is generally placed on the side of the circuit board 20' that is close to the main heat-dissipation surface 111' of the module housing 10', and the heat-dissipation path is shown by the dotted arrow in the figure. However, with the increase of devices, chips with high power consumption are placed on the same side, which will greatly increase the complexity of traces, that requires a large number of conductive vias 22'. In high-speed interconnection, the traces routed through the conductive vias 22' are likely to degrade the signal quality and lower the high-frequency performance. Similarly, when the high-speed signal line 21' is on the side of the circuit board 20' that is close to the main heat-dissipation surface 111' (first housing 11') of the housing 10', the surface for wire-bonding of the photoelectric chip 50' needs to face the main heat-dissipation surface 111', so as make the photoelectric chip 50' to be electrically connected to the high-speed signal line 21' by wire-bonding.

As such, the heat sink 70 needs to be arranged between the optoelectronic chip 50' and the secondary heat-dissipation surface 121' (second housing 12') of the housing 10', so the heat of the optoelectronic chip 50' is conducted to the secondary heat-dissipation surface 121'. The heat is dissipated from the secondary heat-dissipation surface 121', so that the heat-dissipation speed of the photoelectric chip 50' is relatively slow.

SUMMARY

Technical Problems

Solutions to Problems

Technical Solutions

The disclosure aims to provide an optical module package structure, which is capable of effectively improving the heat-dissipation performance and high-frequency performance of an optical module.

To achieve the above, the disclosure provides an optical module package structure including a housing, and a circuit board and at least one first device that are packaged in the housing. The housing includes a first housing and a second housing, and an outer surface of the first housing is a main heat-dissipation surface. A sub-board is further provided in the housing, and the first device is electrically connected to the circuit board through the sub-board.

A first signal line is provided on a surface of the circuit board, and an extension section of the first signal line is provided on a surface of the sub-board. The surface of the sub-board provided with the extension section of the first signal line partially overlaps with and is connected to the surface of the circuit board provided with the first signal line. The first signal line on the circuit board is electrically connected to the extension section on the sub-board. The surface of the sub-board provided with the extension section and the surface of the circuit board provided with the first signal line face opposite directions. The first device is electrically connected to the extension section on the sub-board.

The first device has a heat-dissipation surface, and the heat-dissipation surface faces and is thermally connected to the first housing.

As a further improvement of the embodiment, the circuit board includes a first surface and a second surface opposite to each other. The first surface of the circuit board faces the first housing, and the second surface faces the second housing. The first signal line is located on the second surface.

The sub-board has a third surface and a fourth surface opposite to each other. The extension section is located on the third surface, and the third surface partially overlaps with and is connected to the second surface.

A pad is further provided on the third surface, the pad is electrically connected to the extension section, and the first device is soldered onto the pad.

As a further improvement of the embodiment, a thermal pad is provided between the heat-dissipation surface of the first device and an inner surface of the first housing, and the thermal pad is thermally connected to the first device and the first housing.

As a further improvement of the embodiment, the circuit board includes a first surface and a second surface opposite to each other. The first surface of the circuit board faces the first housing, and the second surface faces the second housing. The first signal line is located on the first surface.

The sub-board has a third surface and a fourth surface opposite to each other. The extension section is located on the fourth surface, and the fourth surface partially overlaps with the first surface.

The first device is electrically connected to the extension section through a bonding wire or a conductive substrate.

As a further improvement of the embodiment, a heat sink is further provided in the housing, and the heat sink is thermally connected to an inner surface of the first housing. The heat-dissipation surface of the first device is thermally connected to the heat sink.

As a further improvement of the embodiment, the first device is mounted on the heat sink.

As a further improvement of the embodiment, the heat sink is fixed onto the inner surface of the first housing, or the heat sink and the first housing are integrally formed.

As a further improvement of the embodiment, the sub-board is at least partially disposed on the heat sink.

As a further improvement of the embodiment, an electrical interface is provided at one end of the circuit board. one end of the first signal line is electrically connected to the electrical interface, and the other end of the first signal line is connected to the extension section on the sub-board by soldering.

As a further improvement of the embodiment, the circuit board is a rigid circuit board, and the sub-board is a rigid conductive substrate.

As a further improvement of the embodiment, the first signal line is configured to transmit a high-frequency signal, and the first device is a high-frequency device.

As a further improvement of the embodiment, the first device includes one or any combinations of a laser, a photodetector, a driver, a signal amplifier, or a silicon photonic chip.

As a further improvement of the embodiment, a second device and one or more electronic elements are further provided in the housing.

A second signal line is further provided on the first surface of the circuit board. The second device is provided on the first surface, and the second device is electrically connected to the second signal line.

The electronic element is provided on the first surface and/or second surface of the circuit board, or the electronic element is provided on the sub-board.

BENEFICIAL EFFECTS OF DISCLOSURE

Beneficial Effects

Beneficial effects of the disclosure includes the following: By adding a sub-board that interconnected to the circuit board, on the one hand, it make most of the devices can dissipate heat by means of the main heat-dissipation surface of the housing of the optical module, and the heat-dissipation performance of the module is effectively improved. On the other hand, the trace space of the circuit board is improved, traces can be routed with fewer vias, and the high-frequency performance of the module is improved.

BRIEF DESCRIPTION OF ACCOMPANY DRAWINGS

Description of Accompanying Drawings

EMBODIMENTS

Implementation of the Disclosure

The disclosure will be described in detail below with reference to the specific embodiments shown in the accompanying figures. However, these embodiments do not limit the disclosure, and the structural, method, or functional transformations made by a person having ordinary skill in the art according to these embodiments are all included in the protection scope of the disclosure.

In various figures of the disclosure, some dimensions of structures or parts are exaggerated relative to other structures or parts for convenience of illustration, and thus, are only used to illustrate the basic structure of the subject matter of the disclosure.

In addition, terms such as "up", "above", "down", "below," etc. are spatially relative terms that are used for ease of description to describe the relationship of one element or feature shown to another element or feature as shown in the accompanying figures. The terms of relative position in space may be intended to encompass different orientations of a device in use or operation other than the orientation shown in the accompanying figures. For instance, if the device in the figures is turned over, units described as "below" or "beneath" other units or features would then be oriented "above" the other units or features. Therefore, the exemplary term "below" may encompass both an orientation of above and below. The device may be otherwise oriented (rotated 90 degrees or otherwise) to interpret the spatially relative descriptors used herein accordingly. When an element or layer is referred to as being "on" and "connected" to another element or layer, it can be directly on and connected to another element or layer, or an intermediate element or a layer may be present.

Embodiment 1

Figure 1:
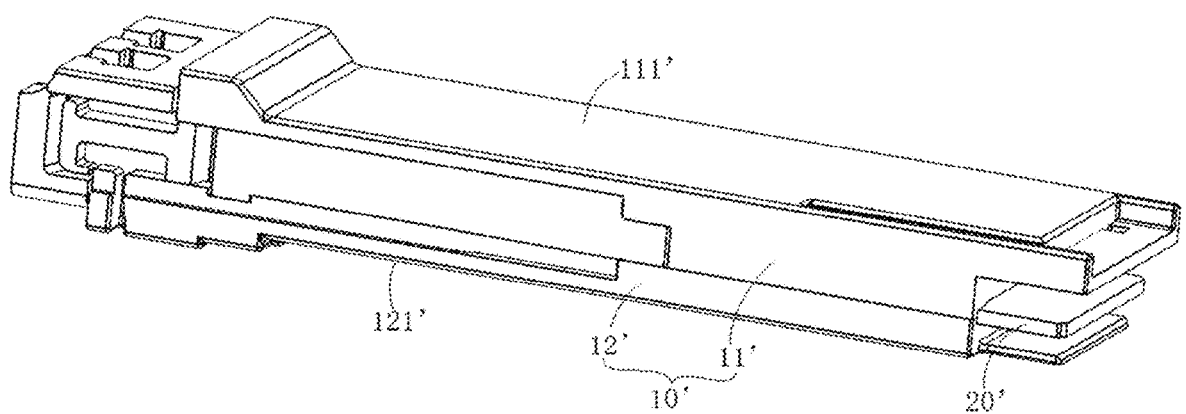
FIG. 1 is a schematic view of the appearance of a conventional optical module.
Figure 2:
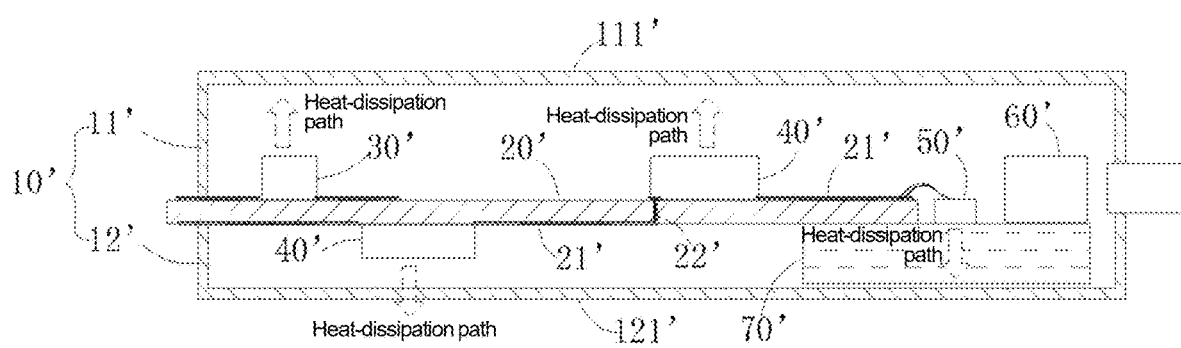
FIG. 2 is a schematic view of a package structure of the conventional optical module.
Figure 3:
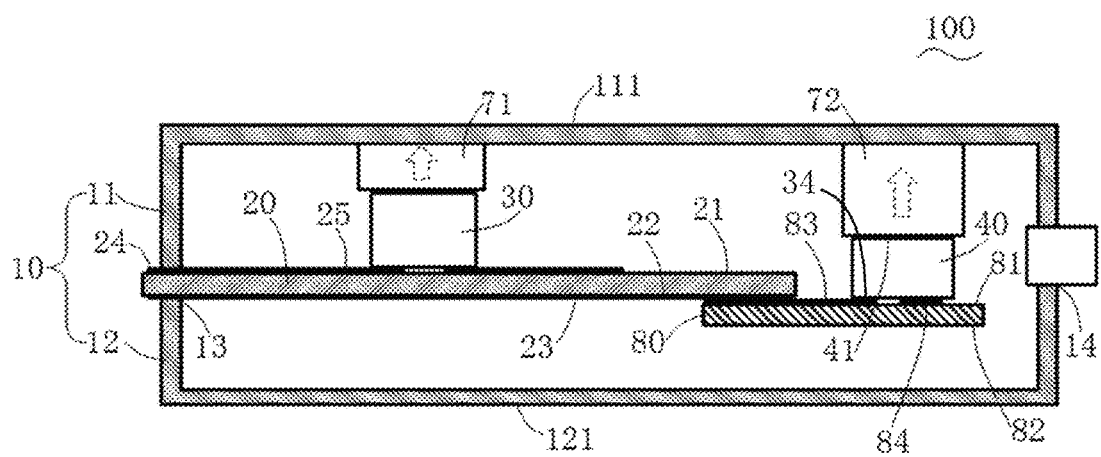
FIG. 3 is a schematic view of an optical module package structure according to Embodiment 1 of the disclosure.
Figure 4:
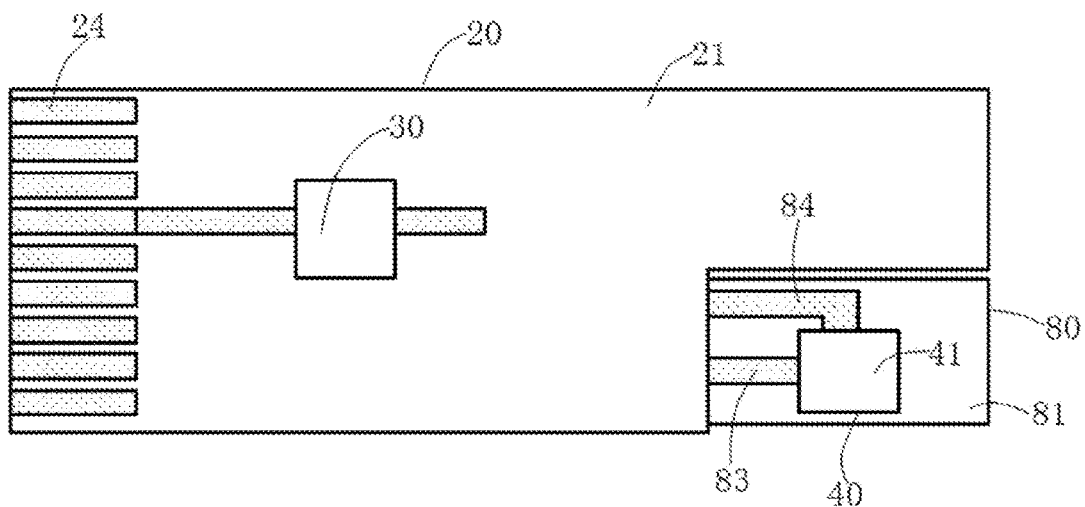
FIG. 4 is a schematic top view of components in the optical module package structure of Embodiment 1.

In the optical module package structure as shown in FIG. 3 and FIG. 4, in an embodiment of the disclosure, an optical module package structure 100 includes a housing 10, and a circuit board 20 and at least one first device 40 that are packaged in the housing 10. The first device 40 has a heat-dissipation surface 41. The housing 10 includes a first housing 11 and a second housing 12. Herein, an outer surface of the first housing 11 is a main heat-dissipation surface 111, an outer surface of the second housing 12 is a secondary heat-dissipation surface 121, and the main heat-dissipation surface 111 has a faster heat-dissipation speed. Herein, the main heat-dissipation surface 111 faces upwards and the secondary heat-dissipation surface 121 faces downwards as an example for illustration. In fact, the optical module package structure 100 can be turned upside down, so that the relative positions of the main heat-dissipation surface 111 and the secondary heat-dissipation surface 121 are reversed. A sub-board 80 is further provided in the housing 10. The first device 40 is electrically connected to the circuit board 20 through the sub-board 80 to ensure that the heat-dissipation surface 41 of the first device 40 faces the first housing 11 and is thermally connected to an inner surface of the first housing 11. In this way, the heat of the first device 40 is dissipated through the main heat-dissipation surface 111 of the first housing 11, and heat-dissipation efficiency is thus improved. Herein, the circuit board 20 is a rigid printed circuit board (PCB), and the sub-board 80 is a rigid conductive substrate. The rigid conductive substrate may be a conductive ceramic substrate, a silicon substrate, a glass substrate, or a resin substrate, etc., or may be the same rigid PCB as the circuit board 20.

A first signal line 23 is provided on a surface of the circuit board 20, and an extension section 83 of the first signal line is provided on a surface of the sub-board 80. The surface of the sub-board 80 provided with the extension section 83 of the first signal line partially overlaps with the surface of the circuit board 20 provided with the first signal line 23, so as to electrically connect the first signal line 23 on the circuit board 20 to the extension section 83 on the sub-board 80. The partially overlapped surfaces of the sub-board 80 and the circuit board 20 face opposite directions, and the first device 40 is electrically connected to the extension section 83 on the sub-board 80. The sub-board 80 and the circuit board 20 may be fixed together by soldering or by insulating glue. An electrical interface 24, such as a gold finger, is provided at one end of the circuit board 20. One end of the first signal line 23 is electrically connected to the electrical interface 24, and the other end is connected to the extension section 83 on the sub-board 80 by soldering. Alternatively, the extension section 83 on the sub-board 80 and the first signal line 83 on the circuit board 20 may be mounted together by surface-mount technology (SMT), so as to electrically connect the extension section 83 and the first signal line 23. The first signal line 23 is configured to transmit a high-frequency signal, and the first device 40 is a high-frequency device, which may be one or any combinations of a laser, a photodetector, a driver, a signal amplifier, or a silicon photonic chip. The housing 10 provides an electrical port 13 and an optical port 14, the electrical interface 24 of the circuit board 20 extends out of the electrical port 13 of the housing 10 for electrical connection with the outside, and the optical port 14 of the housing 10 is configured to transmit an optical signal.

In this embodiment, the circuit board 20 has a first surface 21 and a second surface 22 opposite to each other. The first surface 21 faces the first housing 11, the second surface 22 faces the second housing 12, and the first signal line 23 is located on the second surface 22. Each of the first surface 21 and the second surface 22 of the circuit board 20 is provided with the electrical interface 24, and the first signal line 23 is connected to the electrical interface 24 of the second surface 22. A second signal line 25 for transmitting signals and a second device 30 electrically connected to the second signal line 25 are also provided on the first surface 21. The second signal line 25 is connected to the electrical interface 24 on the first surface 21 for signal transmission between the electrical interface 24 and the second device 30. The first signal line 23 is connected to the electrical interface 24 on the second surface 22 for signal transmission between the electrical interface 24 and the first device 40. The second signal line 25 is also a high-frequency signal line, and the second device 30 is a high-frequency device, which may also be one or any combinations of a laser, a photodetector, a driver, a signal amplifier, or a silicon photonic chip. That is, each of the first device 40 and the second device 30 is one or any combinations of a laser device, a photodetector, a driver, a signal amplifier, or a silicon photonic chip. Generally, the first device 40 and the second device 30 are different devices, and the quantities of them may be one, two, or more. The first device 40 refers to a device electrically connected to the electrical interface 24 on the second surface 22 of the circuit board 20 through the first signal line 23, and the second device 30 refers to a device electrically connected to the electrical interface 24 on the first surface 21 of the circuit board 20 through the second signal line 25. The first device 40 is generally soldered to the second surface 22 of the circuit board 20, which has low heat-dissipation efficiency. Alternatively, the first device 40 is soldered to the first surface 21 of the circuit board 20, and the first signal line 23 is conductively connected to the first device 40 through a conductive via, and the use of a conductive via affects the high-frequency performance. The second device 30 is generally soldered onto the first surface 21 of the circuit board 20, a heat-dissipation surface thereof faces the first housing 11, and the heat may be dissipated through the main heat-dissipation surface 111 of the first housing 11. The heat-dissipation path is shown by the dotted arrow in FIG. 3, and the heat-dissipation speed is fast.

The sub-board 80 has a third surface 81 and a fourth surface 82 opposite to each other. The extension section 83 of the first signal line 23 is located on the third surface 81, and the third surface 81 partially overlaps with the second surface 22 of the circuit board 20, so that one end of the extension section 83 and one end of the first signal line 23 are soldered together. In this embodiment, part of the sub-board 80 may be soldered to the second surface 22 of the circuit board 20 by means of surface-mount technology, so that the extension section 83 on the sub-board 80 is electrically connected to the first signal line 23 on the second surface 22 of the circuit board 20, and that the first signal line 23 facing away from the first housing 11 is extended to the extension section 83 facing the first housing 11. A pad 34 is further provided on the third surface 81 of the sub-board 80, and the pad 34 is electrically connected to the extension section 83. For instance, the pad 34 is provided on the end of the extension section 83, and the first device 40 is soldered onto the pad 34, so that the first device 40 which generally faced away from the first housing 11 and been soldered to the second surface 22 of the circuit board 20 to electrically connect the first signal line 23 is turned over, and that the heat-dissipation surface 41 of the first device 40 will face the first housing 11 to dissipate heat through the main heat-dissipation surface 111 of the first housing 11. The heat-dissipation path is shown by the dotted arrow in FIG. 3, and the heat-dissipation efficiency is effectively improved. Moreover, the first signal line 23 on the second surface 22 of the circuit board 20 is not required to penetrate to the first surface 21 by a conductive via. In this way, the influence of tracing through the via on high-frequency signals is reduced, the trace space of the circuit board 20 is improved, and the high-frequency performance of the module is improved. In other embodiments, the sub-board may also be soldered to the second surface of the circuit board by means of the ball grid array (BGA) technology. In this embodiment, a grounding wire 84 is further provided on the sub-board 80, and the first device 40 is electrically connected to the grounding wire 84 as well. The grounding wire 84 is electrically connected to a grounding wire (not shown) on the circuit board 20, and the connection therebetween is the same as the connection between the first signal line 23 and the extension section 83. In other embodiments, the first device 40 may not be directly connected to the grounding wire or may be connected to other signal lines.

In this embodiment, electronic elements, such as capacitors, inductors, resistors, etc., or other electric chips that generate less heat, may also be provided on the circuit board 20, and these electronic elements may be provided on the first surface 21 and/or the second surface 22 of the circuit board 20. In other embodiments, other electronic elements may also be provided on the third surface and/or the fourth surface of the sub-board. For instance, in an optical transceiver module, an optical element and an optoelectronic chip (not shown) are provided near the optical port 14 of the housing 10. The optical element is one or any combinations of several of a coupling lens, a collimating lens, a wavelength division multiplexer, an optical socket, or an optical fiber, and the optoelectronic chip is, for example, one or more lasers, one or more photodetectors, or one or more silicon photonic chips. On the first surface 21 of the circuit board 20, the second device 30, such as a signal amplifier, is provided, and the driver, acting as the first device 40, is soldered onto the pad 34 of the sub-board 80 and is electrically connected to the extension section 83 of the first signal line 23. The optical signal received by the optical port 14 of the optical module package structure 100 is coupled to the photodetector through the optical elements, and converted into an electrical signal by the photodetector for transmitting to the circuit board 20, and, after being amplified by the signal amplifier (second device 30), the electrical signal is transmitted to other processors through the second signal line 25, or is transmitted to the outside of the optical module package structure 100 through the electrical interface 24 of the circuit board 20. The electrical signal received by the electrical port 13 of the optical module package structure 100 is processed by the processor on the circuit board 20 and then transmitted to the driver (first device 40) on the sub-board 80 through the first signal line 23 on the second surface 22, drives the laser to work through the driver, and excites the laser to send out an optical signal. The optical signal is transmitted through the optical element and output from the optical port 14 end of the optical module package structure 100. In this way, the second device 30 electrically connected to the second signal line 25 on the first surface 21 of the circuit board 20, such as a signal amplifier, etc., may be directly soldered onto the first surface 21 of the circuit board 20, then the heat may be dissipated through the main heat-dissipation surface 111 of the first housing 11. As well as, the first device 40 is electrically connected to the first signal line 23 on the second surface 22 of the circuit board 20 by the means of extending the first signal line 23 to the extension section 83 and the pad 34 on the third surface 81 of the sub-board 80 that faces the first housing 11 through the sub-board 80. Therefore, the first device 40 electrically connected to the first signal line 23 on the second surface 22, such as a driver, may be soldered onto the pad 34 on the third surface 81 of the sub-board 80. As such, the heat-dissipation surface 41 of the first device 40 also faces the first housing 11, so that heat may be dissipated from the main heat-dissipation surface 111 of the first housing 11, and the heat-dissipation efficiency thereof is improved. Moreover, the first signal line 23 extending to the extension section 83 on the sub-board 80 does not require a conductive via to pass through the circuit board 20. In this way, the influence of the conductive via on high-frequency signals is reduced, the trace space of the circuit board is improved, and the high-frequency performance of the module is improved.

In this embodiment, thermal pads 72 and 71 are also provided between the heat-dissipation surface 41 of the first device 40 and the inner surface of the first housing 11, and between the heat-dissipation surface of the second device 30 on the first surface 21 of the circuit board 20 and the inner surface of the first housing 11. The thermal pad 72 is thermally connected to the first device 40 and the first housing 11. The thermal pad 71 is thermally connected to the second device 30 and the first housing 11. In this way, the speed of heat-dissipation from the first device 40 and the second device 30 to the first housing 11 is accelerated, and the heat-dissipation efficiency of the optical module is further improved.

Figure 5:
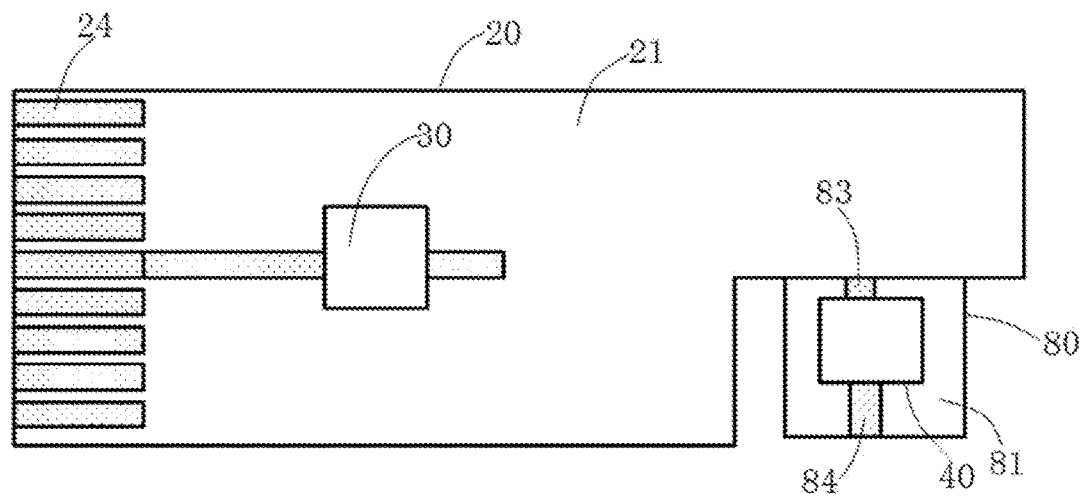
FIG. 5 is a schematic top view of a variation structure of the components in the optical module package structure of Embodiment 1.
Figure 6:
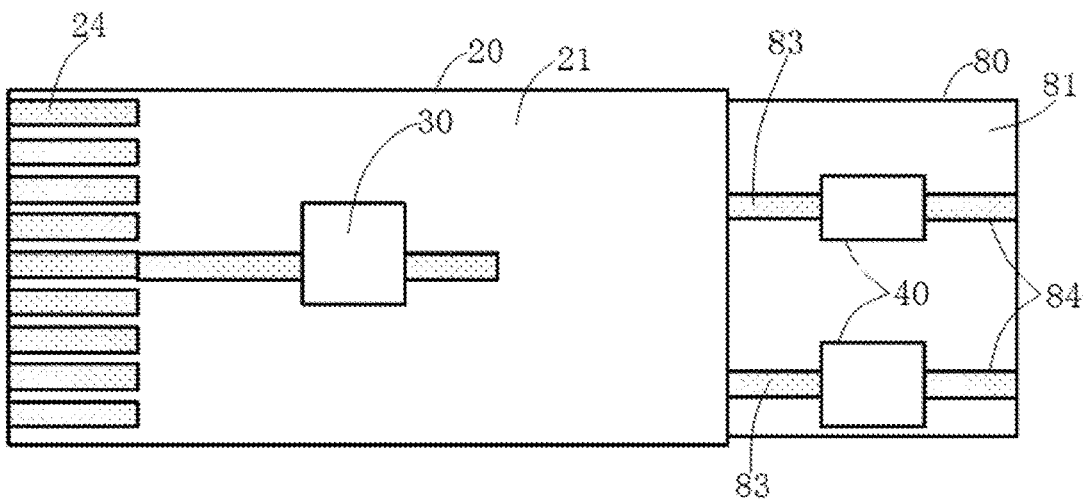
FIG. 6 is a schematic top view of another variation structure of the components in the optical module package structure of Embodiment 1.

As shown in FIG. 4, it is a schematic top view of components in the optical module package structure 100. In this embodiment, the other end of the circuit board 20 opposite to the electrical interface 24 has a notch, and one end of the sub-board 80 is soldered to the notch of the circuit board 20 in a length extending direction of the circuit board 20. The first signal line extends onto the sub-board 80 in the length extending direction of the circuit board 20. In other embodiments, as shown in FIG. 5, the other end of the circuit board 20 opposite to the electrical interface 24 has a notch as well in this embodiment, and one end of the sub-board 80 is soldered to the notch of the circuit board 20 in a width extending direction of the circuit board 20. The first signal line extends onto the sub-board 80 in the width extending direction of the circuit board 20. As shown in FIG. 6, different from the embodiments shown in FIG. 4 and FIG. 5, in this embodiment, the circuit board 20 does not have a notch, and the sub-board 80 is directly soldered onto the other end of the circuit board 20 opposite to the electrical interface 24. The two first signal lines on the second surface of the circuit board 20 both extend onto the third surface 81 of the sub-board 80. The third surface 81 of the sub-board 80 has two extension sections 83 of the first signal lines, two first devices 40, and two grounding wires 84. The two first devices 40 are soldered to the pads of the two extension sections 83, respectively. The two first devices 40 may be two identical devices, such as two drivers, or two different devices, such as one driver and one signal amplifier. Similarly, in the embodiments shown in FIG. 4 and FIG. 5, the quantity of the first devices 40 may also be two or more. The specific shape of the circuit board may be designed according to the needs of the actual circuit trace layout, and a suitable position may be selected for the soldering of the sub-board. The specific shape of the circuit board and the position for the soldering of the sub-board are not limited by what is shown in the figure, and different variations are within the protection scope of the disclosure.

Embodiment 2

Figure 7:
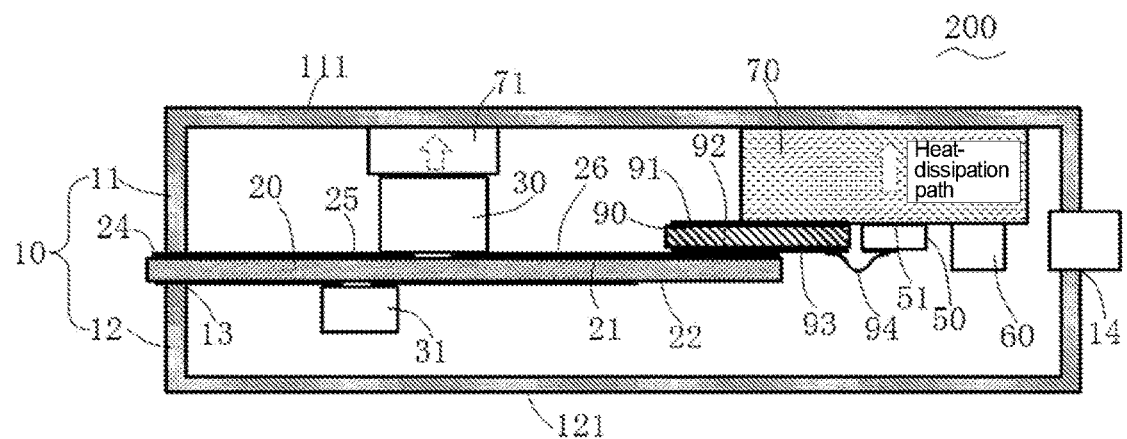
FIG. 7 is a schematic view of an optical module package structure according to Embodiment 2 of the disclosure.
Figure 8:
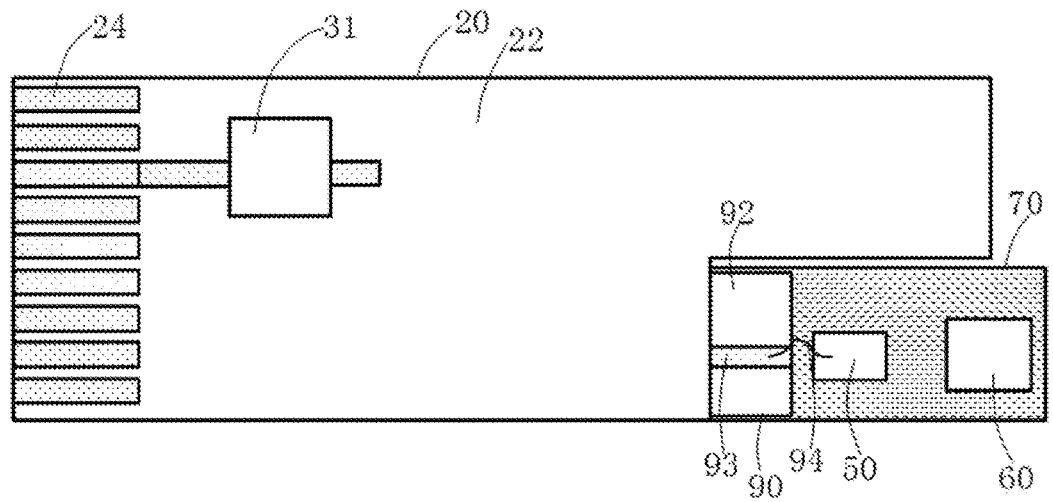
FIG. 8 is a schematic bottom view of components in the optical module package structure of Embodiment 2.

An optical module package structure 200 shown in FIG. 7 and FIG. 8 is another embodiment of the disclosure. The difference between this embodiment and Embodiment 1 is that a first device 50 in this embodiment is electrically connected to the pad of an extension section 93 on a sub-board 90 through a bonding wire or other conductive elements. A first signal line 26 electrically connected to the first device 50 on the circuit board 20 is located on the first surface 21 of the circuit board 20. The first signal line 26 is electrically connected to the electrical interface 24 on the first surface 21 of the circuit board 20 for signal transmission between the electrical interface 24 on the first surface 21 of the circuit board 20 and the first device 50. For instance, a photodetector, a laser, or a silicon photonic chip is treated as the first device 50 and is generally electrically connected to the first signal line 26 on the first surface 21 of the circuit board 20 by using a bonding wire. The pad of the first device 50 is generally in the same direction as the first surface 21 of the circuit board 20, that face the first housing 11, and the heat-dissipation surface 51 of the first device 50 faces the second housing 12. The heat is dissipated through the secondary heat-dissipation surface 121 of the second housing 12, and the heat-dissipation efficiency is relatively low. In this embodiment, the first signal line 26 on the first surface 21 of the circuit board 20 is extended to the extension section 93 on a fourth surface 92 of the sub-board 90 through the sub-board 90. The first device 50 is then electrically connected to the pad of the extension section 93 on the sub-board 90 through bonding wires 94, etc., so that the first device 50 whose heat-dissipation surface 51 generally face the second housing 12 is turned over to make the heat-dissipation surface 51 face the first housing 11 and dissipate heat from the main heat-dissipation surface 111 of the first housing 11 to improve its heat-dissipation efficiency.

To be specific, the first surface 21 of the circuit board 20 faces the first housing 11, the second surface 22 faces the second housing 12, and the first signal line 26 is located on the first surface 21. The sub-board 90 has a third surface 91 and a fourth surface 92 opposite to each other, the third surface 91 faces the first housing 11, and the fourth surface 92 is opposite to the first surface 21 of the circuit board 20. The extension section 93 and its pad are located on the fourth surface 92, and the fourth surface 92 partially overlaps with the first surface 21. The sub-board 90 is partially soldered onto the first surface 21 of the circuit board 20 by surface-mount technology or ball grid array technology. That is, the fourth surface 92 of the sub-board 90 partially overlaps with the first surface 21 of the circuit board 20, so that one end of the extension section 93 and one end of the first signal line 26 are soldered together. As such, the first signal line 26 on the first surface 11 of the circuit board 20 is extended to the extension section 93 on the fourth surface 62 of the sub-board 90. The first device 50 is electrically connected to the pad of the extension section 93 on the sub-board 90 through the bonding wire 94 or the conductive substrate. The first device 50 is located next to the sub-board 90, and its pad is in the same direction as the fourth surface 92 of the sub-board 90, both facing the second housing 12, and its heat-dissipation surface 51 faces the first housing 11 to dissipate heat from the main heat-dissipation surface 111 of the first housing 11, so that heat-dissipation efficiency is effectively improved. Same as embodiment 1, in this embodiment, the first signal line 26 extending to the extension section 93 on the fourth surface 92 of the sub-board 90 does not require a conductive via to pass through the circuit board 20. In this way, the influence of the via in the trace on high-frequency signals is reduced, the trace space of the circuit board is improved, and the high-frequency performance of the module is improved.

In this embodiment, a heat sink 70 is further provided in the housing 10, the heat sink 70 is thermally connected to the inner surface of the first housing 11. The heat-dissipation surface 51 of the first device 50 is thermally connected to the heat sink 70. At least one optical element 60 is also provided between the first device 50 and the optical port 14 of the housing 10, such as one or any combinations of a coupling lens, a collimating lens, a wavelength division multiplexer, an optical socket, or an optical fiber. To be specific, the first device 50 is mounted on the heat sink 70, the heat sink 70 is fixed onto the inner surface of the first housing 11 by heat-dissipation glue, or in other embodiments, the heat sink 70 may be integrally formed with the first housing 11. In this embodiment, the sub-board 90 is at least partially fixed onto the heat sink 70 by glue, and the first device 50 is located near the sub-board 90 close to one end or one side of the sub-board 90. When the first device 50 is a laser, the laser is disposed on a substrate, and the substrate is then fixed onto the heat sink 70, or the substrate is fixed onto the heat sink 70 through an insulating heat conduction pad, such as aluminum nitride ceramics. In this embodiment, the heat sink 70 also acts as a carrier, for carrying the optical element 60, that is, the optical element 60 is mounted on the heat sink 70. In other embodiments, the optical element 60 may also be mounted on another carrier. In this embodiment, electronic elements 31, such as capacitors, inductors, resistors, etc., or other electric chips that generate less heat, may also be provided on the circuit board 20, and these electronic elements 31 may be provided on the first surface 21 and/or the second surface 22 of the circuit board 20.

Same as Embodiment 1, in this embodiment, the specific shape of the circuit board may be designed according to the needs of the actual circuit trace layout, and a suitable position may be selected for the soldering of the sub-board. The specific shape of the circuit board and the position for the soldering of the sub-board are not limited by what is shown in the figure, and different variations are within the protection scope of the disclosure.

Embodiment 3

Figure 9:
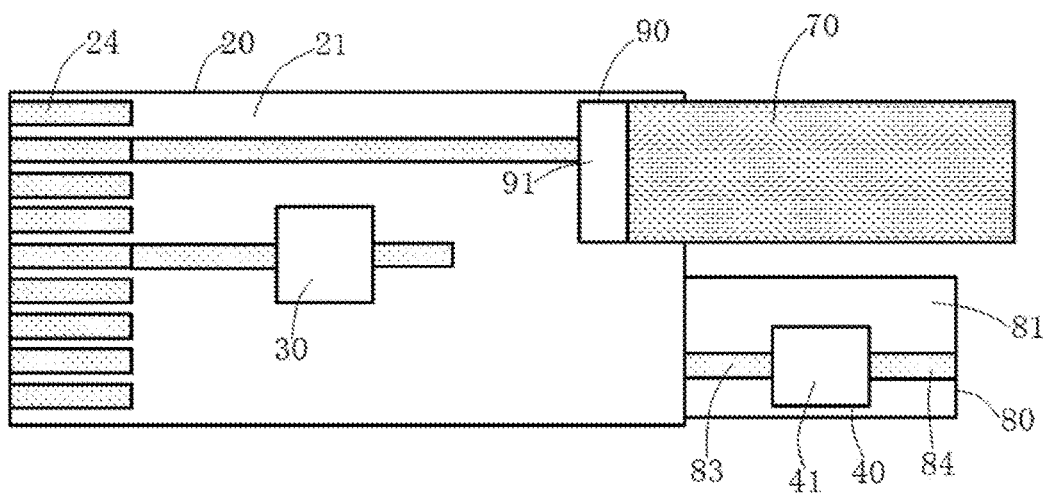
FIG. 9 is a schematic top view of components in an optical module package structure of Embodiment 3.
Figure 10:
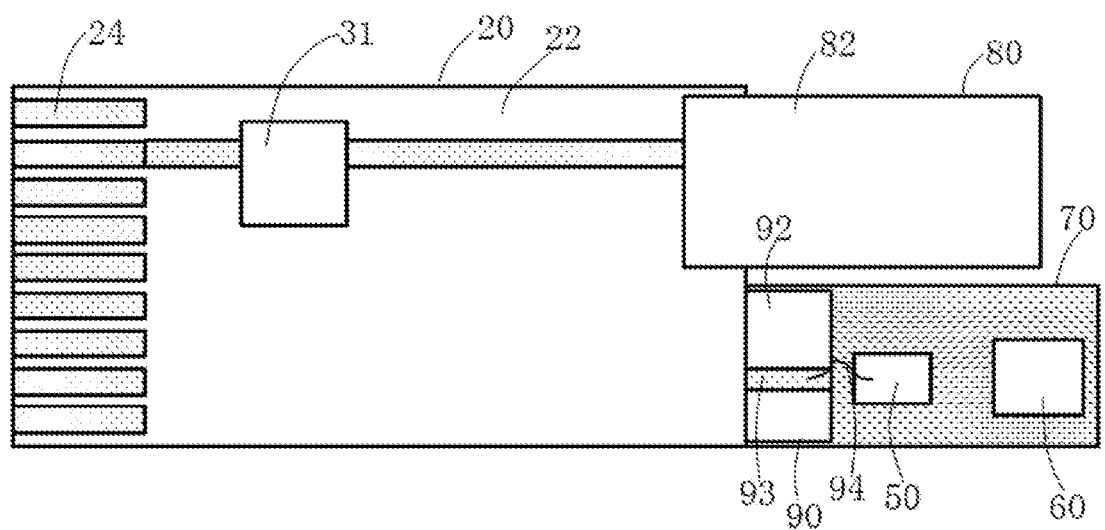
FIG. 10 is a schematic bottom view of the components in the optical module package structure of Embodiment 3.

FIG. 9 is a schematic top view of components in an optical module package structure of Embodiment 3. FIG. 10 is a schematic bottom view of the components in the optical module package structure of Embodiment 3. The housing is omitted in the figures, as in Embodiments 1 and 2, the first housing and its main heat-dissipation surface are located above, and the second housing and its secondary heat-dissipation surface are located below. The difference between this embodiment and Embodiments 1 and 2 is that, in this embodiment, two sub-boards are provided: a first sub-board 80 (same as the sub-board 80 in Embodiment 1) and a second sub-board 90 (same as the sub-board 90 in Embodiment 2). The first device 40 is soldered onto the first sub-board 80, and the second sub-board 90 is electrically connected to another first device 50 through the bonding wire 94. That is, this embodiment is equivalent to a combination of the two structures of Embodiment 1 and Embodiment 2. For instance, a photodetector (i.e., the first device 40) is soldered onto the first sub-board 80, a laser (i.e., the first device 50) is mounted next to the second sub-board 90, and the laser and the second sub-board 90 are electrically connected through the bonding wire 94.

To be specific, in this embodiment, the first signal line 23 is provided on the second surface 22 of the circuit board 20, and the first signal line 23 extends to the extension section 83 on the third surface 81 of the first sub-board 80 (same as the sub-board 80 in Embodiment 1). The first device 40 is provided on the third surface 81 of the first sub-board 80. The first device 40 is electrically connected to the extension section 83 by soldering, so as to be electrically connected to the first signal line 23 on the second surface 22 of the circuit board 20 through the extension section 83. In this way, the first device 40 generally soldered onto the second surface 22 of the circuit board 20 may be turned over and soldered onto the third surface 81 of the first sub-board 80. As such, the heat-dissipation surface of the first device 40 faces the first housing, so that heat may be dissipated from the main heat-dissipation surface of the first housing, and the heat-dissipation efficiency is improved.

Further, the first signal line 26 is also provided on the first surface 21 of the circuit board 20, and the first signal line 26 extends to the extension section 93 on the fourth surface 92 of the second sub-board 90 (same as the sub-board 90 in Embodiment 2). Another first device 50 is provided on one side of or near the end of the second sub-board 90. The first device 50 is electrically connected to the extension section 93 on the second sub-board 90 through the bonding wire 94, so as to be electrically connected to the first signal line 26 on the first surface 21 of the circuit board 20 through the extension section 93 on the second sub-board 90. As such, the first device 50 generally disposed next to the circuit board 20 and electrically connected to the first surface 21 of the circuit board 20 by the bonding wire may be turned over and may be electrically connected to the fourth surface 92 of the second sub-board 90 through the bonding wire. As such, the heat-dissipation surface of the first device 50 faces the first housing, so that heat may be dissipated from the main heat-dissipation surface of the first housing, and the heat-dissipation efficiency is improved.

In this embodiment, electronic elements 31, such as capacitors, inductors, resistors, etc., or other electric chips that generate less heat, may also be provided on the circuit board 20, and these electronic elements 31 may be provided on the first surface 21 and/or the second surface 22 of the circuit board 20.

The structure of this embodiment can ensure that the heat-dissipation surfaces of the first devices 40 and 50 in different connection modes (e.g., soldering or wire-bonding, etc.) both face the first housing. The main heat-dissipation path is the main heat-dissipation surface of the first housing, which can quickly dissipate heat, so heat-dissipation efficiency is effectively improved.

The series of detailed descriptions listed above are only specific descriptions of feasible implementations of the disclosure, and they are not intended to limit the protection scope of the disclosure. All equivalent embodiments or modifications made without departing from the technical spirit of the disclosure shall be included within the protection scope of the disclosure.

What is claimed is:

1. An optical module package structure, comprising a housing, and a circuit board and at least one first device that are packaged in the housing, wherein the housing comprises a first housing and a second housing, and an outer surface of the first housing is a main heat-dissipation surface, wherein a sub-board is further provided in the housing, and the at least one first device is electrically connected to the circuit board through the sub-board, a first signal line is provided on a surface of the circuit board, an extension section of the first signal line is provided on a surface of the sub-board, the surface of the sub-board provided with the extension section of the first signal line partially overlaps with and is connected to the surface of the circuit board provided with the first signal line, the first signal line on the circuit board is electrically connected to the extension section on the sub-board, the surface of the sub-board provided with the extension section and the surface of the circuit board provided with the first signal line face opposite directions, the sub-board is directly soldered to the circuit board, and the at least one first device is electrically connected to the extension section on the sub-board, the at least one first device has a heat-dissipation surface, and the heat-dissipation surface faces and is thermally connected to the first housing.

2. The optical module package structure according to claim 1, wherein:

the circuit board comprises a first surface and a second surface opposite to each other, the first surface of the circuit board faces the first housing, the second surface faces the second housing, and the first signal line is located on the second surface, the sub-board has a third surface and a fourth surface opposite to each other, the extension section is located on the third surface, and the third surface partially overlaps with and is connected to the second surface, a pad is further provided on the third surface, the pad is electrically connected to the extension section, and the at least one first device is soldered onto the pad.

3. The optical module package structure according to claim 2, wherein: a thermal pad is provided between the heat-dissipation surface of the at least one first device and an inner surface of the first housing, and the thermal pad is thermally connected to the at least one first device and the first housing.

4. The optical module package structure according to claim 2, wherein:

an electrical interface is provided at one end of the circuit board, one end of the first signal line is electrically connected to the electrical interface, and another end of the first signal line is connected to the extension section on the sub-board by soldering.

5. The optical module package structure according to claim 2, wherein:

a second device and one or more one or more electronic elements are further provided in the housing, a second signal line is further provided on the first surface of the circuit board, the second device is provided on the first surface, and the second device is electrically connected to the second signal line, the one or more electronic element is provided on the first surface and/or second surface of the circuit board, or the one or more electronic element is provided on the sub-board.

6. The optical module package structure according to claim 1, wherein:

the circuit board comprises a first surface and a second surface opposite to each other, the first surface of the circuit board faces the first housing, the second surface faces the second housing, and the first signal line is located on the first surface, the sub-board has a third surface and a fourth surface opposite to each other, the extension section is located on the fourth surface, and the fourth surface partially overlaps with the first surface, the at least one first device is electrically connected to the extension section through a bonding wire or a conductive substrate.

7. The optical module package structure according to claim 6, wherein: a heat sink is further provided in the housing, the heat sink is thermally connected to an inner surface of the first housing, and the heat-dissipation surface of the at least one first device is thermally connected to the heat sink.

8. The optical module package structure according to claim 7, wherein: the at least one first device is mounted on the heat sink.

9. The optical module package structure according to claim 7, wherein: the heat sink is fixed onto the inner surface of the first housing, or the heat sink and the first housing are integrally formed.

10. The optical module package structure according to claim 7, wherein: the sub-board is at least partially disposed on the heat sink.

11. The optical module package structure according to claim 6, wherein:
an electrical interface is provided at one end of the circuit board, one end of the first signal line is electrically connected to the electrical interface, and another end of the first signal line is connected to the extension section on the sub-board by soldering.

12. The optical module package structure according to claim 6, wherein:
a second device and one or more one or more electronic elements are further provided in the housing,
a second signal line is further provided on the first surface of the circuit board, the second device is provided on the first surface, and the second device is electrically connected to the second signal line,
the one or more electronic element is provided on the first surface and/or second surface of the circuit board, or the one or more electronic element is provided on the sub-board.

13. The optical module package structure according to claim 1, wherein:
an electrical interface is provided at one end of the circuit board, one end of the first signal line is electrically connected to the electrical interface, and another end of the first signal line is connected to the extension section on the sub-board by soldering.

14. The optical module package structure according to claim 1, wherein:
the circuit board is a rigid circuit board, and the sub-board is a rigid conductive substrate.

15. The optical module package structure according to claim 1, wherein:
the first signal line is configured to transmit a high-frequency signal, and the at least one first device is a high-frequency device.

16. The optical module package structure according to claim 15, wherein:
the at least one first device comprises one or any combinations of a laser, a photodetector, a driver, a signal amplifier, or a silicon photonic chip.

17. The optical module package structure according to claim 1, wherein:
a second device and one or more electronic elements are further provided in the housing,
a second signal line is further provided on a first surface of the circuit board, the second device is provided on the first surface, and the second device is electrically connected to the second signal line,
the one or more electronic element is provided on the first surface and/or a second surface of the circuit board, or the one or more electronic element is provided on the sub-board.

* * * * *